(12) United States Patent
Ahn et al.

(10) Patent No.: US 8,901,548 B2
(45) Date of Patent: Dec. 2, 2014

(54) DUAL-MODE PIXEL INCLUDING EMISSIVE AND REFLECTIVE DEVICES AND DUAL-MODE DISPLAY WITH THE SAME

(71) Applicant: Electronics and Telecommunications Research Institute, Daejeon (KR)

(72) Inventors: Joon Tae Ahn, Daejeon (KR); Jeong Ik Lee, Daejeon (KR); Jaehyun Moon, Daejeon (KR); Seung Koo Park, Daejeon (KR); Nam Sung Cho, Daejeon (KR); Doo-Hee Cho, Daejeon (KR); Jun-Han Han, Daejeon (KR); Joo Hyun Hwang, Seoul (KR); Jin Wook Shin, Incheon (KR); Jong Tae Lim, Seoul (KR); Chul Woong Joo, Seoul (KR); Jin Woo Huh, Daejeon (KR); Chi-Sun Hwang, Daejeon (KR); Hojun Ryu, Seoul (KR); Jae Bon Koo, Daejeon (KR); Hye Yong Chu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/920,134

(22) Filed: Jun. 18, 2013

(65) Prior Publication Data

US 2014/0158997 A1  Jun. 12, 2014

(30) Foreign Application Priority Data

Dec. 12, 2012 (KR) .................... 10-2012-0144284

(51) Int. Cl.
*H01L 29/08* (2006.01)
*H01L 27/32* (2006.01)

(52) U.S. Cl.
CPC ................. *H01L 27/3232* (2013.01)
USPC ........................................ 257/40; 345/173

(58) Field of Classification Search
CPC ............ G02F 2201/44; H01L 27/3232; H01L 27/3244
USPC .......................................... 257/40
See application file for complete search history.

(56) References Cited

U.S. PATENT DOCUMENTS

| 7,170,506 | B2 | 1/2007 | Eldon et al. | |
|---|---|---|---|---|
| 2011/0050545 | A1* | 3/2011 | Namm et al. | 345/5 |
| 2011/0267279 | A1 | 11/2011 | Rivera et al. | |
| 2012/0223295 | A1* | 9/2012 | Inoue et al. | 257/40 |

FOREIGN PATENT DOCUMENTS

| JP | 2002-196702 A | 7/2002 |
|---|---|---|
| KR | 10-2008-0112673 A | 12/2008 |

* cited by examiner

*Primary Examiner* — Kevin M Picardat
*Assistant Examiner* — Paul Patton
(74) *Attorney, Agent, or Firm* — Rabin & Berdo, P.C.

(57) ABSTRACT

Provided is a dual-mode display including a substrate, and a plurality of sub pixels on the substrate. Each of the sub pixels may include an emissive device, a reflective optical filter provided on a surface of the emissive device, and an optical shutter provided on other surface of the emissive device.

16 Claims, 6 Drawing Sheets

DUAL-MODE PIXEL INCLUDING EMISSIVE AND REFLECTIVE DEVICES AND DUAL-MODE DISPLAY WITH THE SAME

CROSS-REFERENCE TO RELATED APPLICATIONS

This U.S. non-provisional patent application claims priority under 35 U.S.C. §119 to Korean Patent Application No. 10-2012-0144284, filed on Dec. 12, 2012, in the Korean Intellectual Property Office, the entire contents of which are hereby incorporated by reference.

BACKGROUND OF THE INVENTION

Example embodiments of the inventive concept relate to a dual-mode pixel including emissive and reflective devices and a dual-mode display with the dual-mode pixel, and in particular, to a dual-mode pixel, in which an integrated structure of emissive and reflective devices is provided, and a dual-mode display with the same.

Generally, the display technology may be classified into three types: transmissive, emissive, and reflective displays. A thin film transistor liquid crystal display (TFT-LCD) is a typical example of the transmissive display. The TFT-LCD is widely used for application such as TV, monitor, and cellular phone. However, for the TFT-LCD, there are technical disadvantages, such as large power consumption and non-flexibility.

In the emissive display, there are an organic light emitting device (OLED) and a plasma display panel (PDP). Since the emissive display has self-emission type pixels, the emissive display has technical advantages, such as fast response speed, high contrast ratio, and good color gamut. The OLED can be used to realize a flexible display and/or a transparent display, because it can be fabricated to have an ultra-thin thickness.

In the reflective display, there are an electrophoretic display, an electro wetting display, a photonic crystal display, and a microelectromechanical system (MEMS). The reflective display is operated using an external light, such as sunlight or illumination light. Accordingly, when bright external light is provided, the reflective display can realize an image of good quality with low power consumption. For all that, the reflective display has image quality worse than the transmissive and emissive displays.

The transmissive display and the emissive display can provide a vivid image, under indoor or dark environment. However, they suffer from low visibility, under outdoor or bright environment. There are many researches to develop a device capable of displaying a vivid image under both of indoor and outdoor environment, with low energy consumption.

SUMMARY

Example embodiments of the inventive concept provide a dual-mode pixel and a dual-mode display with the same. Here, the dual-mode pixel is configured to include emissive and reflective devices, and thus, this makes it possible to reduce power consumption and improve image quality of the pixel and display.

According to example embodiments of the inventive concepts, a dual-mode display may include a substrate, and a plurality of sub pixels on the substrate. Each of the sub pixels may include an emissive device, a reflective optical filter provided on a surface of the emissive device, and an optical shutter provided on other surface of the emissive device.

In example embodiments, the emissive device may be an organic light emitting diode.

In example embodiments, the organic light emitting diode may include an anode, a hole injection layer, a hole transfer layer, a light emitting layer, an electron transfer layer, an electron injection layer, and a cathode that may be sequentially stacked on the substrate.

In example embodiments, the reflective optical filter may be one of a Fabry-Perot optical filter, a photonic crystal optical filter, an absorptive optical filter, or a transmissive optical filter with a reflector.

In example embodiments, the optical shutter may be operated using one of electrophoresis, electrowetting, electrochromic, and liquid crystal technologies.

In example embodiments, the dual-mode display may further include an intermediate insulating layer interposed between the reflective optical filter and the emissive device.

In example embodiments, the intermediate insulating layer may be formed of silica, titanium oxide, or a mixture thereof.

In example embodiments, the emissive device may be configured to emit light through both surfaces thereof.

In example embodiments, the reflective optical filter may be configured to reflect a fraction of light propagating from the emissive device toward the reflective optical filter.

According to example embodiments of the inventive concepts, a dual-mode display may include a substrate, and a plurality of sub pixels on the substrate. Each of the sub pixels may include a reflective optical filter, an optical shutter provided on the reflective optical filter, and an emissive device provided on the optical shutter.

In example embodiments, the emissive device may be an organic light emitting diode.

In example embodiments, the reflective optical filter may be one of a Fabry-Perot optical filter, a photonic crystal optical filter, an absorptive optical filter, or a transmissive optical filter with a reflector.

In example embodiments, the optical shutter may be operated using one of electrophoresis, electrowetting, electrochromic, and liquid crystal technologies.

According to example embodiments of the inventive concepts, a dual-mode display may include a substrate, and a plurality of sub pixels on the substrate. The plurality of unit pixels may include a reflective device, and a transparent emissive device on the reflective device. The reflective device serves as an optical filter configured in such a way that color of light reflected thereby may be controlled by an electric signal provided from the outside.

In example embodiments, the emissive device may be an organic light emitting diode.

In example embodiments, the organic light emitting diode may include an anode, a hole injection layer, a hole transfer layer, a light emitting layer, an electron transfer layer, an electron injection layer, and a cathode that may be sequentially stacked on the substrate.

In example embodiments, the emissive device may be configured to emit light through both surfaces thereof.

In example embodiments, the reflective device may be configured to reflect a fraction of light propagating from the emissive device toward the reflective device.

In example embodiments, the reflective device may be one of a MEMS-based reflective device, an electrowetting device, or an electrochromic device.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
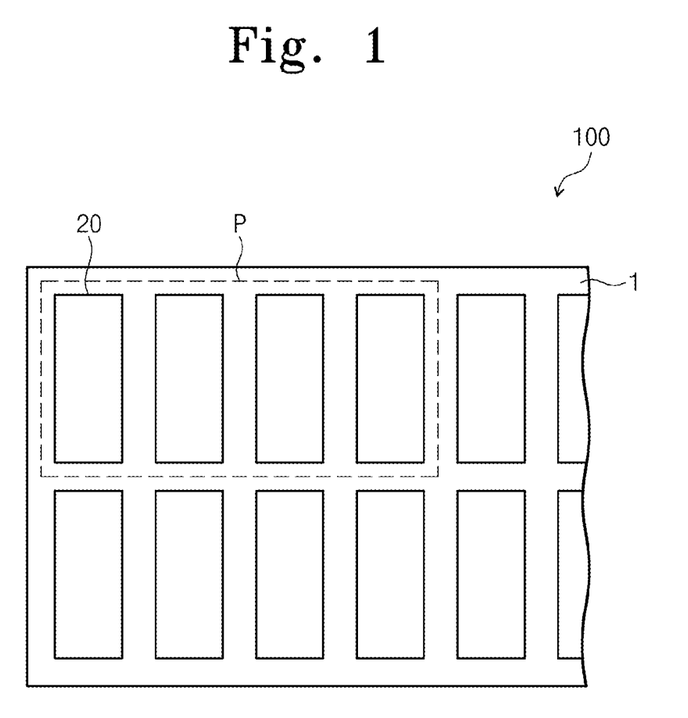
FIG. 1 is a plan view illustrating a dual-mode display with dual-mode pixels according to example embodiments of the inventive concept.
Figure 2:
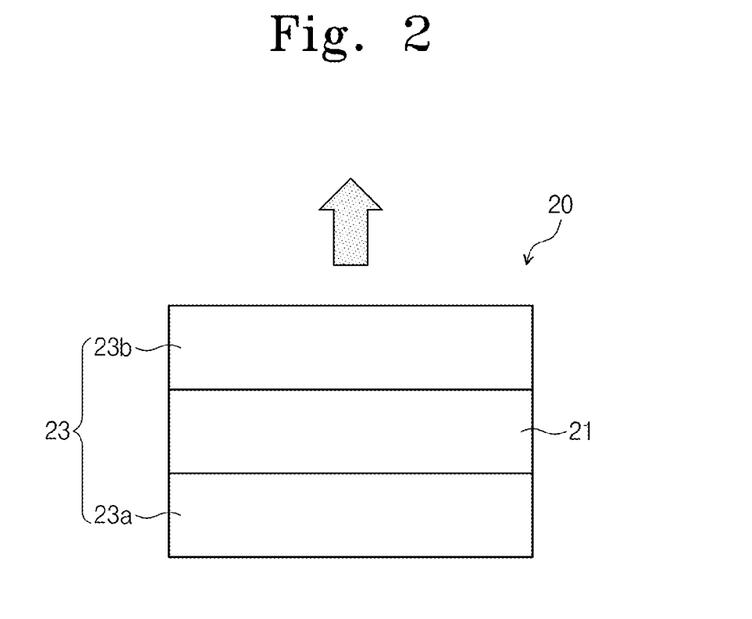
FIG. 2 is a sectional view illustrating a dual-mode pixel with emissive and reflective devices, according to example embodiments of the inventive concept.

FIG. 1 is a plan view illustrating a dual-mode display with dual-mode pixels according to example embodiments of the inventive concept. FIG. 2 is a sectional view illustrating a dual-mode pixel with emissive and reflective devices, according to example embodiments of the inventive concept.

Referring to FIGS. 1 and 2, a reflective optical filter 23a may be provided on a surface of an emissive device 21, and an optical shutter 23b may be provided on other surface of the emissive device 21. The reflective optical filter 23a and the optical shutter 23b may constitute a reflective device 23. A dual-mode display 100 may include a plurality of pixels P, each of which includes a plurality of sub pixels 20. Each sub pixel 20 may include the emissive device 21, the reflective optical filter 23a, and the optical shutter 23b. Each of the sub pixels 20 may be configured to display a corresponding one of red color (R), green color (G), and blue color (B). In certain embodiments, the pixel P may further include an additional sub pixel 20 configured to display white color (W). The plurality of sub pixels 20 may be operated at the same time, when the dual-mode display 100 displays a still or moving image.

The reflective optical filter 23a, the emissive device 21, and the optical filter 23b may be stacked on one substrate 1 to form one sub pixel 20. Alternatively, the reflective optical filter 23a, the emissive device 21, and the optical filter 23b may be formed on different substrates, respectively, and then, be stacked to form the sub pixel 20. The substrate 1 may be flexible. For example, the flexible substrate may be a plastic substrate, a thin glass substrate, or a metal substrate.

Figure 5:
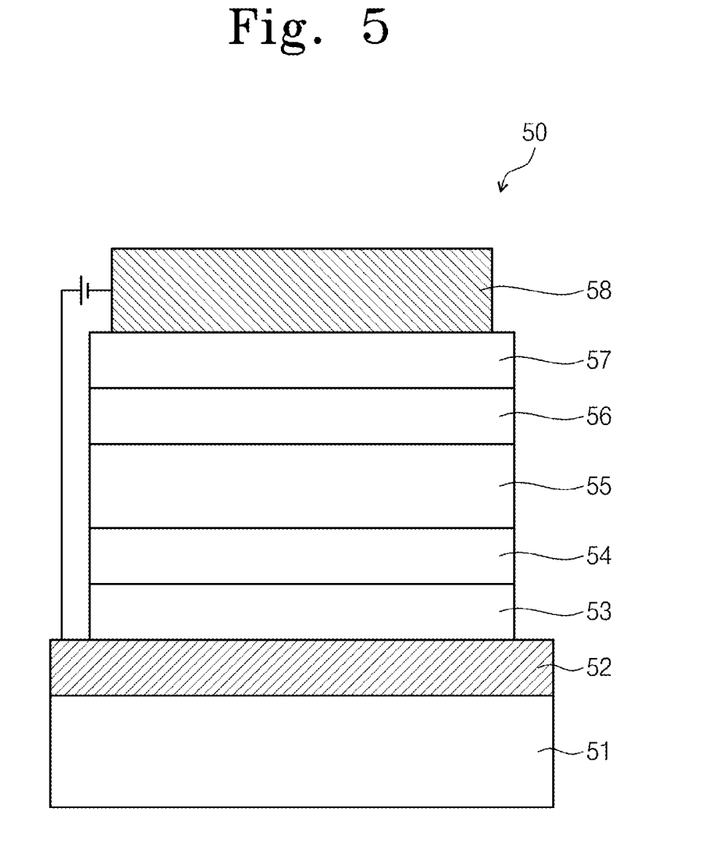
FIG. 5 is a sectional view of a conventional organic light emitting diode.

The emissive device 21 may be provided in the form of an organic light emitting diode 50 shown in FIG. 5. However, the emissive device 21 may not be limited to the organic light emitting diode, and be a flexible emissive device that can be adopted for a display device. The emissive device 21 may be configured to emit a light with a specific wavelength through both surfaces thereof.

The reflective optical filter 23a may be provided in the form of a Fabry-Perot optical filter, a photonic crystal optical filter, an absorptive optical filter, or a transmissive optical filter with a reflector.

The photonic crystal optical filter may be configured to control reflection or absorption of an incident light using a nano structure smaller than a wavelength of light. For example, the photonic crystal optical filter may be configured in such a way that light with a desired wavelength passes through it and light with other is reflected.

The Fabry-Perot optical filter may be configured to include two highly reflective substrates and a cavity therebetween. As the result of a multiple interference effect in the cavity, a fraction of an incident light with a specific wavelength is reflected from the Fabry-Perot optical filter and the other is transmitted through the Fabry-Perot optical filter.

The absorptive optical filter may be configured to reflect light with a desired wavelength and absorb the other colors.

The transmissive optical filter with a reflector may be configured in such a way that a fraction of an incident light with a specific wavelength is transmitted through the transmissive optical filter and then is reflected by the reflector.

The optical shutter 23b may be operated using one of electrophoresis, electrowetting, electrochromic, and liquid crystal technologies. The optical shutter 23b may be configured to transmit or block a light that is incident from the outside or generated in the emissive device 21.

Electrophoresis is the motion of dispersed particles relative to a fluid under the influence of an electric field. In the electrophoresis technology, movement of particles to be adsorbed onto an electrode surface can be controlled by a voltage applied to the electrode, and thus, the electrophoresis technology can be used to realize an optical shutter. The electrophoresis technology can achieve an optical switching speed of about 1 sec.

Electrowetting is the modification of the wetting properties of a surface with an applied electric field. In the electrowetting device, conductive fluid with polar group and high transmittance and colored non-polar oil exhibit different behaviors under an applied electric field. For example, depending on the applied electric field, the colored non-polar oil may be shrunk or not, and thus, the electrowetting device may serve as an optical shutter. The electrowetting technology can realize an optical switching speed of about 10 msec.

Electrochromic is the phenomenon displayed by some materials of reversibly changing color when a burst of charge is applied. The electrochromic technology can realize an optical switching speed of about 100 msec.

The liquid crystal technology is realized by using a dye-containing liquid crystal. For example, when a voltage is applied to the liquid crystal, a liquid crystal device exhibits a varying transmittance, as the result of a change in direction of liquid crystal molecules. The liquid crystal technology can realize an optical switching speed of about several msec.

In the case that the optical shutter 23b is in the open state and the emissive device 21 is operated, light generated in the emissive device 21 may be emitted to the outside through the optical shutter 23b.

A fraction of the light propagating the emissive device 21 toward the reflective optical filter 23a may be reflected or transmitted through by the reflective optical filter 23a. The reflective optical filter 23a may be configured in such a way that reflectance of the external light varies depending on a thickness of the reflective optical filter 23a and a wavelength of the external light. Here, the reflective optical filter 23a may be configured to reflect a light with a specific wavelength range or a specific color. In example embodiments, the reflective optical filter 23a may be configured to reflect a light that has substantially the same wavelength range as that of light generated in the emissive device 21.

In the case that the optical shutter 23b is in the open state and the emissive device 21 is not operated, an external light may pass through the optical shutter 23b and the emissive device 21 and transmit through or be reflected from the reflective optical filter 23a. In example embodiments, the sub pixel 20 may be operated by light reflected from the reflective optical filter 23a.

In the case that the optical shutter 23b is in the closed state, since light from the emissive device 21 is blocked by the optical shutter 23b, the sub pixel 20 may display black color, even when the emissive device 21 is operated.

If the emissive device 21, the optical filter 23a, and the optical shutter 23b are integrated to constitute one sub pixel 20, the sub pixel 20 in a bright or outdoor environment can be operated using the reflective optical filter 23a, without the use of the emissive device 21, and the sub pixel 20 in a dark or indoor environment can be operated using the emissive device 21. Accordingly, the dual-mode display 100 with the dual-mode pixel P can provide a better image quality, without any environment limitation.

In addition, in the case where the emissive device 21 is configured to emit light through both surfaces thereof, a fraction of the light may be emitted toward an opposite direction of the optical shutter 23b. In other words, the fraction of the light may not be used for a display operation of the dual-mode display 100. By contrast, according to example embodiments of the inventive concept, due to the presence of the reflective optical filter 23a, the fraction of the light propagating toward the opposite direction of the optical shutter 23b may be reflected by the reflective optical filter 23a and emitted to the outside. Accordingly, most of the light emitted from the emissive device 21 can be emitted to the outside. As a result, it is possible to realize the dual-mode display 100 with improved lightning property.

Further, the emissive device 21 may be realized using an organic light emitting diode that can be formed to have an ultra-thin thickness, and thus, it is possible to realize the dual-mode display 100 with flexibility.

Figure 3:
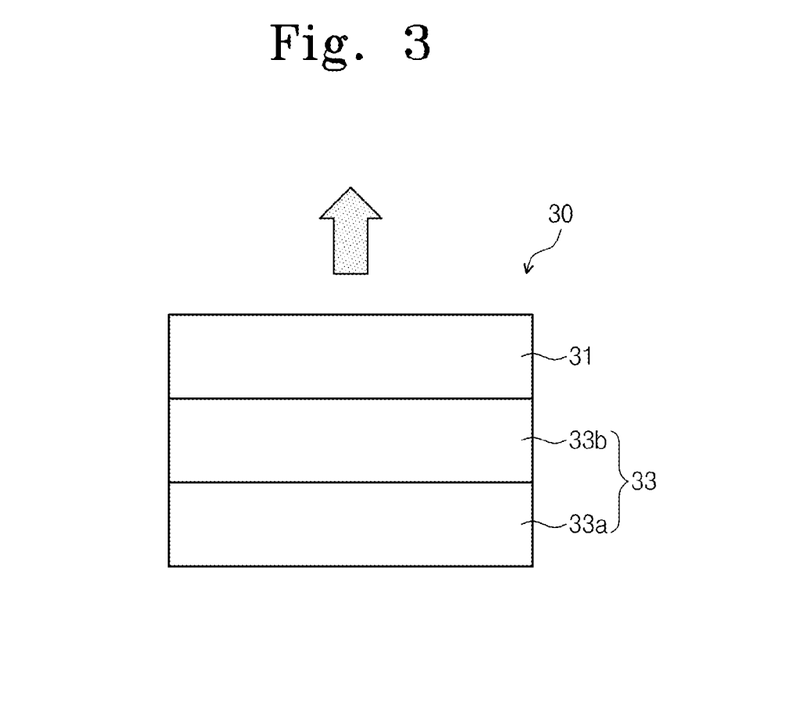
FIG. 3 is a sectional view illustrating a dual-mode pixel with emissive and reflective devices, according to other example embodiments of the inventive concept.

FIG. 3 is a sectional view illustrating a dual-mode pixel with emissive and reflective devices, according to other example embodiments of the inventive concept.

Referring to FIG. 3, a sub pixel 30 may include a reflective device 33 and an emissive device 31. The emissive device 31 may be provided on the reflective device 33. The reflective device 33 may include a reflective optical filter 33a and an optical shutter 33b. The optical shutter 33b may be interposed between the emissive device 31 and the reflective optical filter 33b. The emissive device 31 may be configured to emit light through both surfaces thereof.

In the case where the optical shutter 33b is in the closed state and the emissive device 31 is operated, a fraction of light generated in the emissive device 31 may be directly emitted to the outside. However, other fraction of the light propagating toward the optical shutter 33b may not be emitted to the outside, because the optical shutter 33b is in the closed state.

In the case where the optical shutter 33b is in the open state and the emissive device 31 is operated, a fraction of light generated in the emissive device 31 may be directly emitted to the outside, and other fraction of the light propagating toward the optical shutter 33b may be reflected by the reflective optical filter 33a and be emitted to the outside through the optical shutter 33b and the emissive device 31. Accordingly, the emissive device 31 may emit light to the outside through both surfaces thereof.

In the case where the optical shutter 31 is in the open state and the emissive device 31 is not operated, an external light may pass through the emissive device 31 and the optical shutter 33b and then, be transmitted through or reflected by the reflective optical filter 33a. The light reflected by the reflective optical filter 33a may be used for a display operation of the sub pixel 30.

Figure 4:
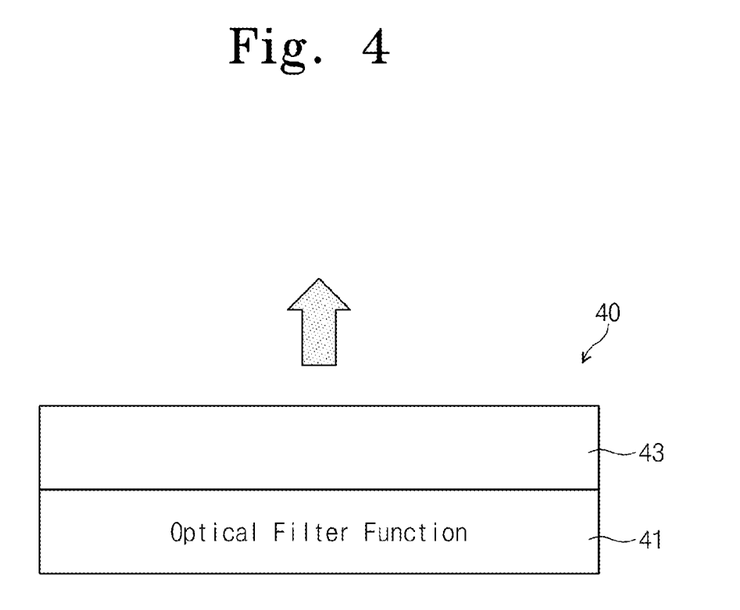
FIG. 4 is a sectional view illustrating a dual-mode pixel with emissive and reflective devices, according to still other example embodiments of the inventive concept.

FIG. 4 is a sectional view illustrating a dual-mode pixel with emissive and reflective devices, according to still other example embodiments of the inventive concept.

Referring to FIG. 4, a sub pixel 40 may include a reflective device 41 and an emissive device 43. The emissive device 43 may be provided on the reflective device 41.

The reflective device 41 may be configured in such a way that a wavelength of light to be reflected therefrom is changed by an electric signal applied thereto, and therefore, the reflective device 41 may serve as optical filter. For example, the reflective device 41 may be configured to reflect different colors, depending on the presence and the absence of an operation voltage applied to the reflective device 41. The reflective device 41 may be one of a MEMS-based reflective device, an electrowetting device, and an electrochromic device.

In example embodiments, the MEMS-based reflective device may be a Fabry-Perot optical filter. The Fabry-Perot optical filter may include two metal substrates and a dielectric substrate interposed between the metal substrates. The dielectric substrate may be in contact with one of the metal substrates and be spaced apart from the other. A space between the metal substrates may be changed by an electric signal applied to the MEMS-based reflective device, and thus, the dielectric substrate and the metal substrate spaced apart therefrom may become in contact with each other. The MEMS-based reflective device may have a switching speed of about tens of microseconds.

Color to be reflected from the MEMS-based reflective device may be changed depending on the space of the metal substrates. For example, in the case where the MEMS-based reflective device is applied with a voltage, color to be reflected from the MEMS-based reflective device may be one of red, blue, green, and white colors. In the case where the MEMS-based reflective device is not applied with a voltage, the MEMS-based reflective device may display black color.

The metal substrates may include at least one of silver (Ag), aluminum (Al), gold (Au), cobalt (Co), chromium (Cr), nickel (Ni), or tungsten (W). The dielectric substrate may be formed of a transparent dielectric material. For example, the dielectric substrate may be formed of silicon dioxide ($SiO_2$) or titanium dioxide ($TiO_2$).

The electrowetting device may include two substrates and an electro-wetting element interposed therebetween to control reversely transmission and reflection of an external light using an electric field. The electro-wetting element may include conductive and highly transmissive colorless fluid with polar group and colored non-polar oil. The electrowetting device may have a switching speed of about 10 msec or less.

During operations of the electrowetting device, a voltage may be applied to two opposite electrodes provided on the substrates, respectively, to generate an electric field between the substrates. Due to the presence of the electric field, the conductive colorless fluid may be concentrated around a surface of the substrate, and thus, the electrowetting device may be white. By contrast, in the case where the voltage is not applied to the electrodes, the colored non-polar oil may be concentrated around the surface of the substrate to reflect an external light. Accordingly, the electrowetting device may take on the color of the colored non-polar oil.

In the electrochromic device, a color of an electrochromic material may be changed by controlling a chemical reaction using an electric signal. The electrochromic device may have a switching speed of about 100 msec.

The electrochromic device may include two opposite electrodes that are interposed between the transparent substrates spaced apart from each other. The electrochromic device may further include an electrochromic layer, an electrolyte layer, and an ion storage layer that are sequentially provided between the two electrodes. During operations of the electrochromic device, a voltage may be applied between the electrodes to produce an electric current. If the electric current flows from the electrochromic layer to the ion storage layer, the electrochromic layer may be colored. If the electric current flows from the ion storage layer to the electrochromic layer, the electrochromic layer may be decolorized.

The emissive device 43 may be an organic light emitting diode 50. The emissive device 43 may not be limited to the organic light emitting diode, and be a flexible emissive device that can be adopted for a display device. The emissive device 43 may be configured to emit a light with a specific wavelength through both surfaces thereof.

In the case where the emissive device 43 is not operated, an external light may pass through the emissive device 43 and be transmitted through or reflected by the reflective device 41, depending on whether the reflective device 41 is operated or not. For example, in the case where the reflective device 41 is an electrowetting device and the electrowetting device is operated, the external light may pass through colorless conductive fluid. Accordingly, the sub pixel 40 displays white. By contrast, if the electrowetting device is not operated, the external light may be reflected by the colored non-polar oil. Accordingly, the sub pixel 40 may take on the color of the colored non-polar oil.

In the case where the emissive device 43 is operated, a fraction of light generated in the emissive device 43 may be emitted to the outside, and other fraction of the light may be incident into the reflective device 41. A fraction of the light to be incident into the reflective device 41 may be transmitted through or reflected by the reflective device 41, depending on whether the reflective device 41 is operated or not. For example, in the case where the reflective device 41 is an electrowetting device and the electrowetting device is not operated, the fraction of the light may be reflected by the colored non-polar oil. Accordingly, the fraction of the light may take on the color of the colored non-polar oil.

FIG. 5 is a sectional view of a conventional organic light emitting diode.

Referring to FIG. 5, the organic light emitting diode 50 may include an anode 52, a hole injection layer 53, a hole transfer layer 54, a light emitting layer 55, an electron transfer layer 56, an electron injection layer 57, and a cathode 58 that are sequentially stacked on a substrate 51.

The substrate 51 may be formed of an optically transparent material. For example, the substrate 51 may be a transparent substrate (e.g., of glass, plastic, or polymer).

The anode 52 may be formed to serve as a transparent electrode or a reflective electrode. For example, in the case where the anode 52 serves as the transparent electrode, it may be formed of indium tin oxide (ITO), indium zinc oxide (IZO), or tin oxide. In the case where the anode 52 serves as the reflective electrode, it may be formed of silver (Ag), aluminum (Al), nickel (Ni), platinum (Pt), or palladium (Pd).

The hole injection layer 53 may be configured to inject holes easily from the anode 52 into the light emitting layer 55. The hole injection layer 53 may be formed of, for example, a low molecular substance, such as copper phthalocyanine (CuPc), TNATA, TCTA, and TDAPB, and a high molecular substance, such as PANI and PEDOT:PSS.

The hole transfer layer 54 may be formed of, for example, a low molecular substance, such as NPB, TPD, s-TAD, and MTTADATA, and a high molecular substance, such as PVK, BFE, and TFB.

The light emitting layer 55 may be a layer configured to emit light. In example embodiments, the light emitting layer 55 may be formed of $Alq_3$.

The electron transfer layer 56 may be formed of, for example, a high molecular substance, such as PBD, TAZ, or spiro-PBD, and a low molecular substance, such as $Alq_3$, BAlq, or SAlq.

The electron injection layer 57 may be configured to inject electrons easily from the cathode 58 into the light emitting layer 55. The electron transfer layer 56 may be formed of, for example, $Alq_3$, Ga complex, or PBD.

The cathode 58 may be formed of magnesium (Mg), calcium (Ca), aluminum (Al), silver (Ag), barium (Ba), or alloys thereof. The cathode 58 may be thin enough to allow light to transmit it.

If a voltage is applied between the anode 52 and the cathode 58 of the organic light emitting diode 50, holes may be generated in the anode 52 and electrons may be generated in the cathode 58. The holes may be injected into the light emitting layer 55 through the hole injection layer 53 and the hole transfer layer 54, and the electrons may be injected into the light emitting layer 55 through the electron injection layer 57 and the electron transfer layer 56. The holes and the electrons may be recombined with each other in the light emitting layer 55 to produce excitons. If the excitons go from an excited state to a ground state, light may be generated in the light emitting layer 55.

Figure 6:
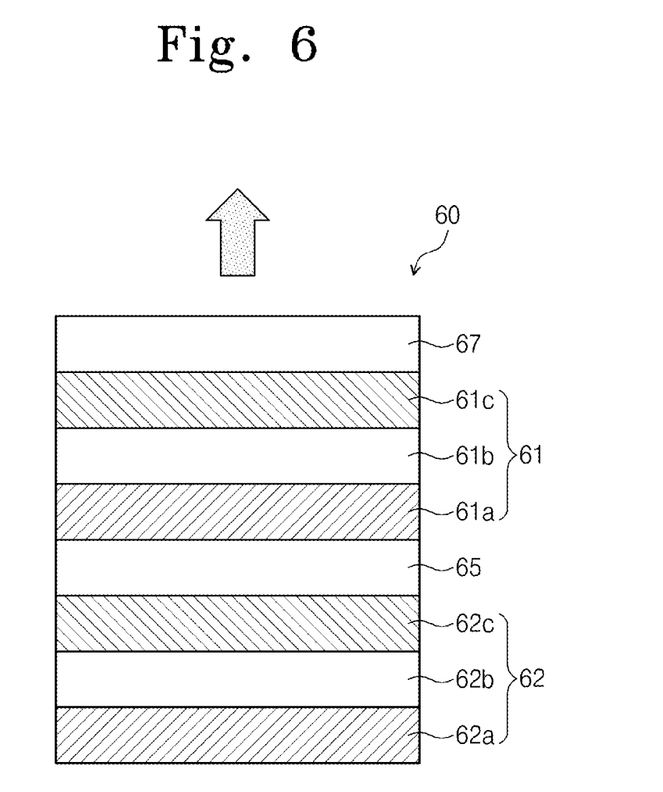
FIG. 6 is a sectional view illustrating a simulation sub pixel with emissive and reflective devices, according to example embodiments of the inventive concept.
Figure 7:
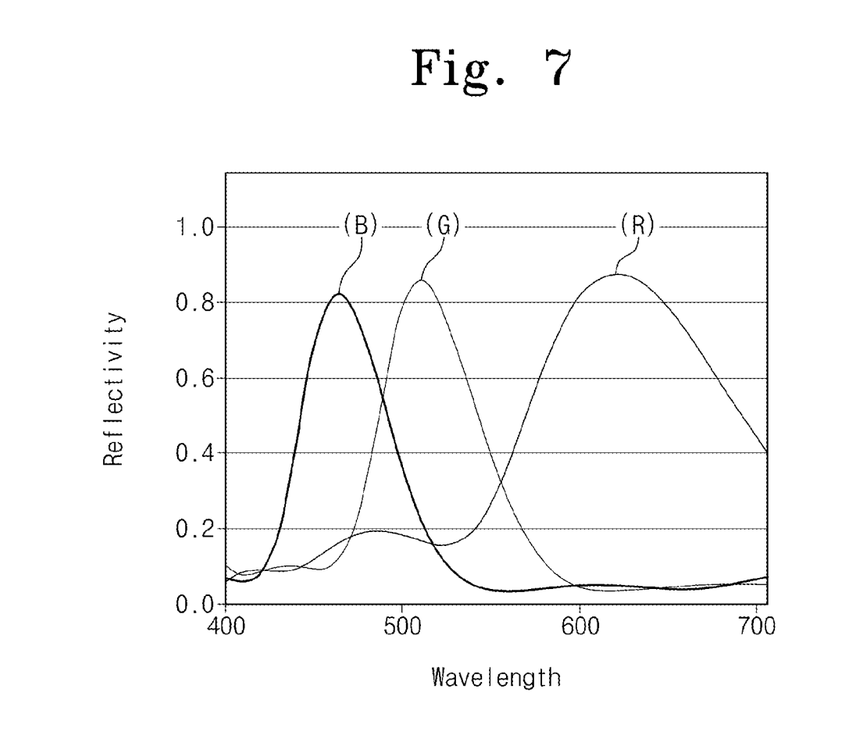
FIG. 7 is a graph of reflectivity plotted against wavelength measured by the simulation sub pixel according to example embodiments of the inventive concept.

FIG. 6 is a sectional view illustrating a simulation sub pixel with emissive and reflective devices, according to example embodiments of the inventive concept. FIG. 7 is a graph of reflectivity plotted against wavelength measured by the simulation sub pixel according to example embodiments of the inventive concept.

Referring to FIG. 6, a simulation sub pixel 60 may include an emissive device 61 and a substrate 67 sequentially provided on a reflective optical filter 62. An intermediate insulating layer 65 may be interposed between the reflective optical filter 62 and the emissive device 61.

The substrate 67 may be formed of an optically transparent material. For example, the substrate 67 may be a transparent substrate (e.g., of glass, plastic, or polymer).

The reflective optical filter 62 may be a Fabry-Perot optical filter. The Fabry-Perot optical filter may include a first metal layer 62*a*, an optical filter insulating layer 62*b*, and a second metal layer 62*c* that are sequentially stacked. In example embodiments, each or all of the first and second metal layers 62*a* and 62*c* may include at least one of silver (Ag), aluminum (Al), gold (Au), cobalt (Co), chromium (Cr), nickel (Ni), or tungsten (W). The optical filter insulating layer 62*b* may be formed of a transparent insulating material. For example, the optical filter insulating layer 62*b* may be formed of silica, titanium oxide, or a mixture thereof. In example embodiments, the first metal layer 62*a* may include a silver-containing layer, the optical filter insulating layer 62*b* may include a silica-containing layer, and the second metal layer 62*c* may include a tungsten-containing layer.

In the Fabry-Perot optical filter, resonance effect of the first and second metal layers 62*a* and 62*c* may be used to reflect selectively light with a desired wavelength. A wavelength of light to be reflected by the Fabry-Perot optical filter may be changed, depending on a thickness of the optical filter insulating layer 62*b*.

The emissive device 61 may be an organic light emitting diode. The organic light emitting diode may include a cathode 61*a*, a light emitting layer 61*b*, and an anode 61*c* that are sequentially stacked. Although not shown in FIG. 6, the light emitting layer 61*b* may further include the hole injection layer 53, the hole transfer layer 54, the electron transfer layer 56, and the electron injection layer 57 described with reference to FIG. 5.

In example embodiments, the cathode 61*a* may be formed of silver (Ag), and the anode 61*c* may be formed of an indium tin oxide (ITO) layer. The cathode 61*a* may be thin enough to minimize an optical loss of an external light incident into the emissive device 61 or of a reflection light reflected by the reflective optical filter 62.

The intermediate insulating layer 65 may include a surface being in contact with the second metal layer 62*c* of the reflective optical filter 62 and other surface being in contact with the cathode 61*a* of the emissive device 61. The intermediate insulating layer 65 may separate the second metal layer 62*c* electrically from the cathode 61*a*. The intermediate insulating layer 65 may include at least one transparent insulating material. The intermediate insulating layer 65 may include silica ($SiO_2$), and the second metal layer 62*c* may include tungsten (W). In example embodiments, the intermediate insulating layer 65 may be formed of silica ($SiO_2$).

Referring to FIG. 7, thicknesses of the cathode 61a, the anode 61c, the first metal layer 62a, the second metal layer 62c, and the intermediate insulating layer 65 were about 2 nm, about 70 nm, about 80 nm, about 8 nm, and about 10 nm, respectively. The optical filter insulating layer 62b was formed to have thicknesses of about 200 nm, about 340 nm, and about 305 nm. The light emitting layer 61b was formed to have thicknesses of about 280 nm, about 220 nm, and about 180 nm. A wavelength of light to be emitted from the simulation sub pixel 60 may be changed, depending on thicknesses of the light emitting layer 61b and the optical filter insulating layer 62b. The graph of FIG. 7 was obtained at an observing angle of 30 degrees.

As shown in FIG. 7, lights of red (R), green (G), and blue (B) emitted from the simulation sub pixel 60 had reflectivity of about 80% or more. This shows that vivid color can be realized by the simulation sub pixel 60. Accordingly, if the sub pixel 60 is used for a dual-mode display, it is possible to realize a better image quality, without any environment limitation.

According to example embodiments of the inventive concept, the dual-mode pixel including emissive and reflective devices may be operated using the reflective optical filter in a bright or outdoor environment and using the emissive device in a dark or indoor environment. Accordingly, the dual-mode display with the dual-mode pixel can provide a better image quality, without any environment limitation.

In the dual-mode pixel, the reflective optical filter may be configured to reflect a fraction of light emitted from the emissive pixel toward the outside or the opposite direction. Accordingly, most of the light generated in the emissive pixel may be emitted to the outside, and thus, the dual-mode display can have an improved lightning property.

While example embodiments of the inventive concepts have been particularly shown and described, it will be understood by one of ordinary skill in the art that variations in form and detail may be made therein without departing from the spirit and scope of the attached claims.

What is claimed is:

1. A dual-mode display, comprising:
  a substrate; and
  a plurality of sub pixels on the substrate,
  wherein each of the sub pixels comprises:
  an emissive device, the emissive device being configured to emit light through two opposite surfaces thereof;
  a reflective optical filter provided on a surface of the emissive device; and
  an optical shutter provided on another surface of the emissive device.

2. The dual-mode display of claim 1, wherein the emissive device is an organic light emitting diode.

3. The dual-mode display of claim 2, wherein the organic light emitting diode comprises
  an anode,
  a hole injection layer,
  a hole transfer layer,
  a light emitting layer,
  an electron transfer layer,
  an electron injection layer, and
  a cathode that are sequentially stacked on the substrate.

4. The dual-mode display of claim 1, wherein the reflective optical filter is one of a Fabry-Perot optical filter, a photonic crystal optical filter, an absorptive optical filter, or a transmissive optical filter with a reflector.

5. The dual-mode display of claim 1, wherein the optical shutter is operated using one of electrophoresis, electrowetting, electrochromic, or liquid crystal technologies.

6. The dual-mode display of claim 1, further comprising an intermediate insulating layer interposed between the reflective optical filter and the emissive device.

7. The dual-mode display of claim 6, wherein the intermediate insulating layer is formed of silica, titanium oxide, or a mixture thereof.

8. The dual-mode display of claim 1, wherein the reflective optical filter is configured to reflect a fraction of light propagating from the emissive device toward the reflective optical filter.

9. A dual-mode display, comprising:
  a substrate; and
  a plurality of sub pixels on the substrate,
  wherein each of the sub pixels comprises:
  a reflective optical filter, the reflective optical filter being one of a Fabry-Perot optical filter, a photonic crystal optical filter, an absorptive optical filter, or a transmissive optical filter with a reflector;
  an optical shutter provided on the reflective optical filter; and
  an emissive device provided on the optical shutter.

10. The dual-mode display of claim 9, wherein the emissive device is an organic light emitting diode.

11. The dual-mode display of claim 9, wherein the optical shutter is operated using one of electrophoresis, electrowetting, electrochromic, or liquid crystal technologies.

12. A dual-mode display, comprising:
  a substrate; and
  a plurality of sub pixels on the substrate,
  wherein the plurality of sub pixels comprises:
  a reflective device being one of a MEMS-based reflective device, an electrowetting device, or an electrochromic device; and
  a transparent emissive device on the reflective device,
  wherein the reflective device serves as an optical filter configured in such a way that color of light reflected thereby is controlled by an electric signal provided from outside the reflective device.

13. The dual-mode display of claim 12, wherein the transparent emissive device is an organic light emitting diode.

14. The dual-mode display of claim 13, wherein the organic light emitting diode comprises
  an anode,
  a hole injection layer,
  a hole transfer layer,
  a light emitting layer,
  an electron transfer layer,
  an electron injection layer, and
  a cathode that are sequentially stacked on the substrate.

15. The dual-mode display of claim 12, wherein the emissive device is configured to emit light through two opposite surfaces thereof.

16. The dual-mode display of claim 15, wherein the reflective device is configured to reflect a fraction of light propagating from the emissive device toward the reflective device.

* * * * *